US011290127B2

United States Patent
Abotabl et al.

(10) Patent No.: US 11,290,127 B2
(45) Date of Patent: Mar. 29, 2022

(54) APPARATUS AND METHOD FOR OFFSET OPTIMIZATION FOR LOW-DENSITY PARITY-CHECK (LDPC) CODE

(71) Applicant: Samsung Electronics Co., Ltd., Gyeonggi-do (KR)

(72) Inventors: Ahmed A. Abotabl, San Diego, CA (US); Kee-Bong Song, San Diego, CA (US); Jung Hyun Bae, San Diego, CA (US)

(73) Assignee: Samsung Electronics Co., Ltd

( * ) Notice: Subject to any disclaimer, the term of this patent is extended or adjusted under 35 U.S.C. 154(b) by 21 days.

(21) Appl. No.: 16/885,566

(22) Filed: May 28, 2020

(65) Prior Publication Data

US 2020/0295782 A1    Sep. 17, 2020

Related U.S. Application Data

(63) Continuation of application No. 16/269,190, filed on Feb. 6, 2019, now Pat. No. 10,727,868.

(60) Provisional application No. 62/774,605, filed on Dec. 3, 2018.

(51) Int. Cl.
*H03M 13/11* (2006.01)
*H03M 13/25* (2006.01)

(52) U.S. Cl.
CPC ...... *H03M 13/1154* (2013.01); *H03M 13/112* (2013.01); *H03M 13/255* (2013.01); *H03M 13/1131* (2013.01)

(58) Field of Classification Search
CPC .......... H03M 13/1154; H03M 13/112; H03M 13/255; H03M 13/1131
See application file for complete search history.

(56) References Cited

U.S. PATENT DOCUMENTS

| 7,174,561 | B2 | 2/2007 | Bixby | |
| 2003/0156652 | A1* | 8/2003 | Wise | G06F 13/1673 375/240.26 |
| 2007/0234180 | A1 | 10/2007 | Edmonston et al. | |
| 2010/0122139 | A1* | 5/2010 | Wang | H03M 13/112 714/752 |
| 2010/0262888 | A1 | 10/2010 | Choi et al. | |
| 2011/0248871 | A1* | 10/2011 | Kim | H03M 7/4018 341/51 |

(Continued)

FOREIGN PATENT DOCUMENTS

EP    2 892 157    7/2015

OTHER PUBLICATIONS

Eliya Nachmani, et al. "Deep Learning Methods for Improved Decoding of Linear Codes", IEEE Journal of Selected Topics in Signa Processing, Jan. 1, 2018, pp. 1-13.

(Continued)

*Primary Examiner* — Kyle Vallecillo
(74) *Attorney, Agent, or Firm* — The Farrell Law Firm, P.C.

(57) ABSTRACT

An apparatus and method are provided. The apparatus includes a decoder including a first input configured to receive transport blocks, a second input, and an output configured to provide a decoded codeword, and an offset value updater including an input connected to the output of the decoder, and an output, connected to the second input of the decoder, configured to provide an updated offset value.

20 Claims, 10 Drawing Sheets

(56) References Cited

U.S. PATENT DOCUMENTS

| | | | |
|---|---|---|---|
| 2011/0264455 A1* | 10/2011 | Nelson | H04N 21/4394 |
| | | | 704/500 |
| 2012/0042228 A1 | 2/2012 | Hekstra | |
| 2012/0096327 A1* | 4/2012 | Cai | H04L 1/0047 |
| | | | 714/752 |
| 2012/0219055 A1* | 8/2012 | He | H04N 19/124 |
| | | | 375/240.03 |
| 2013/0173760 A1 | 7/2013 | Yie | |
| 2016/0028418 A1* | 1/2016 | Subasingha | H04L 1/0006 |
| | | | 714/774 |
| 2016/0072657 A1 | 3/2016 | Vojcic et al. | |
| 2016/0088297 A1* | 3/2016 | Svedberg | H04N 19/513 |
| | | | 375/240.03 |
| 2016/0335536 A1 | 11/2016 | Yamazaki et al. | |

OTHER PUBLICATIONS

Loren Lugosch, et al. "Neural Offset Min-Sum Decoding", 2017 IEEE International Symposium on Information Theory (ISIT), pp. 1361-1365.

3GPP TS 38.212 V15.3.0 (Sep. 2018), "3rd Generation Paternership Project: Technical Specification Group Radio Access Network: NR; Multiplexing and channel coding", (Release 15), pp. 1-99.

Ji, W., et al., "A novel hardware-friendly self-adjustable offset min-sum algorithm for ISDB-S2 LDPC decoder", 2010 18th European Signal Processing Conference, IEEE, Conference Location: Aalborg, Denmark, Date of Conference: Aug. 23-27, 2010, pp. 1394-1398 (Year: 2010).

\* cited by examiner

APPARATUS AND METHOD FOR OFFSET OPTIMIZATION FOR LOW-DENSITY PARITY-CHECK (LDPC) CODE

PRIORITY

This application is a Continuation of U.S. application Ser. No. 16/269,190, which was filed in the United States Patent and Trademark Office (USPTO) on Feb. 6, 2019, and claims priority under 35 U.S.C. § 119(e) to a U.S. Provisional Patent Application Ser. No. 62/774,605, which was filed in the USPTO on Dec. 3, 2018, the entire content of each of which is incorporated herein by reference.

FIELD

The present disclosure relates generally to wireless communication systems, and more particularly, to an apparatus and a method for offset optimization for a low-density parity-check (LDPC) code.

BACKGROUND

LDPC codes have been adopted as the channel coding scheme for the shared channel of the $3^{rd}$ generation partnership project (3GPP) new radio (NR) standards. While sum-product decoding of LDPC codes achieves very good decoding performance, sum-product decoding is accompanied by a large computational complexity. Minimum-sum (min-sum) decoding replaces the complex operations that are used in sum-product decoding with low complexity operations with a cost of a performance loss. Offset min-sum (OMS) decoding of LDPC codes is a method that adds an additive term to the min-sum process in an attempt to approach the sum-product performance while keeping the same complexity of the min-sum process. However, finding the optimal offset for each case (e.g., code parameter, channel condition) may require exhaustive effort.

SUMMARY

According to one embodiment, an apparatus includes a decoder including a first input configured to receive transport blocks, a second input, and an output configured to provide a decoded codeword, and an offset value updater including an input connected to the output of the decoder, and an output, connected to the second input of the decoder, configured to provide an updated offset value.

According to one embodiment, a method includes receiving, by a first decoder, a plurality of codewords and an index that indicates which of the plurality of codewords is to be decoded; decoding, by the first decoder, one of the plurality of codewords indicated by the index; and updating, by an offset value updater, an offset value.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
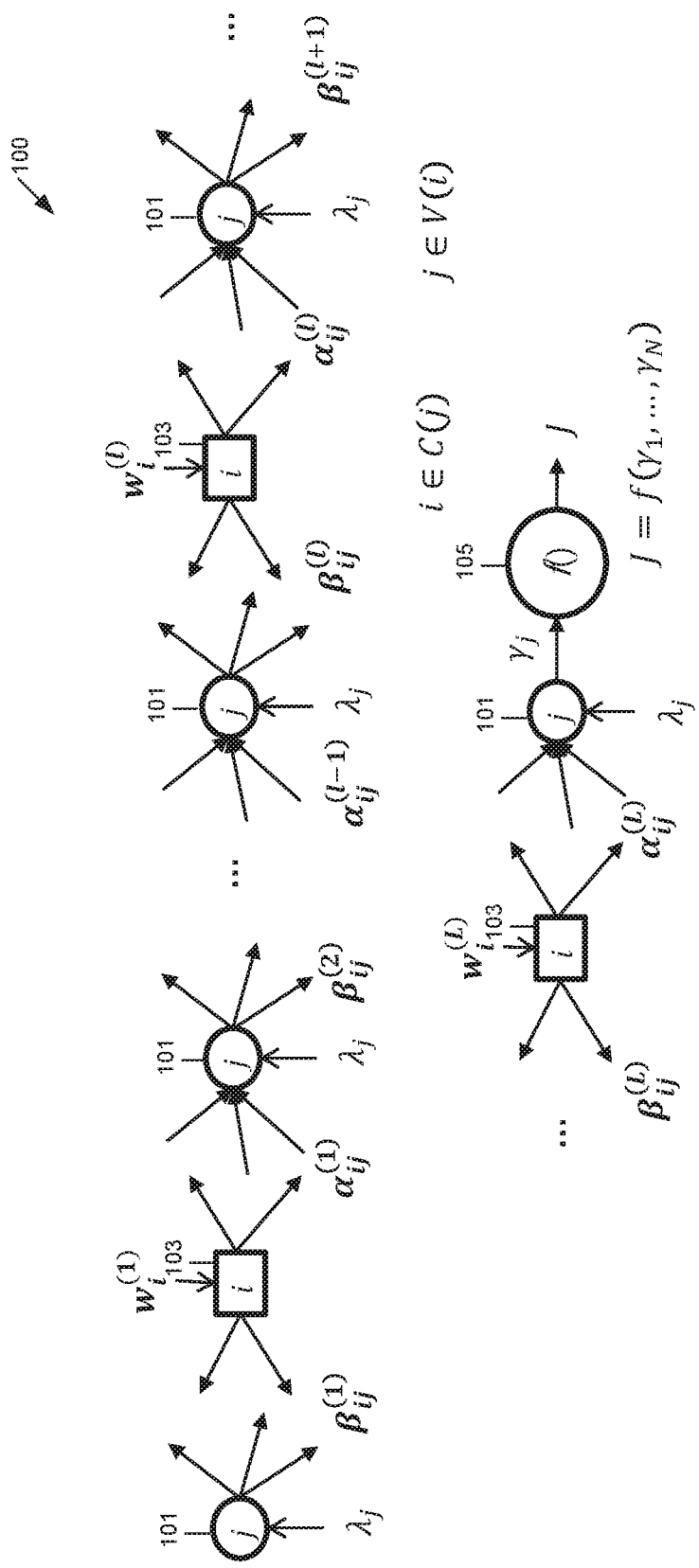
FIG. 1 is an illustration of a network topology for a parallel BP decoder, according to one embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The present disclosure concerns an apparatus and a method for determining an optimal offset value via a gradient descent process where a gradient is calculated via a backpropagation process. The present disclosure includes a method of determining calculations of the gradient. The method not only provides low complexity for gradient calculations but also enables gradient calculations for different scheduling techniques such as parallel and sequential BP. Moreover, the present disclosure discloses methods for adapting to different transmission environments.

In addition, the present disclosure discloses a method for gradient calculations of an offset parameter of BP decoding. The method enables calculations of a gradient of an error function of a decoder with respect to an offset value under any scheduling technique. Furthermore, the present disclosure discloses an optimal offset value under certain code parameters and channel conditions.

Moreover, in order to account for more practical scenarios at which a transmission environment has many parameters that are free to change, the present disclosure discloses methods under such a transmission environment. One method is online learning in which an optimal offset value is learned during the transmission. Another method is to increase a search space of an offset value to find optimal offset values for all transmission environments.

In order to find an optimal offset value under a certain scheduling method, a gradient of a pre-defined error function of a decoder with respect to the offset is calculated and the offset value is changed in a direction that reduces a result of the error function. Therefore, the present disclosure discloses calculating a gradient of an error function of a decoder with respect to an offset value.

An error function and gradient calculations for parallel BP using an OMS method are disclosed below in greater detail. In addition, gradient calculations under sequential scheduling are disclosed as an example. However, the present disclosure applies to any scheduling technique.

FIG. 1 is an illustration of a network topology for a parallel BP decoder 100, according to one embodiment.

Referring to FIG. 1, an output of the BP decoder 100 are log-likelihood ratios (LLRs), $\gamma_i$, where an additional node calculates an error based on the output LLRs, and a correct decision, assuming knowledge of the correct decision over the BP decoder 100 output.

FIG. 1 illustrates an L+1 layer network including 1 input layers, L−2 hidden layers, 1 output layers, and 1 cost function computation layer.

l is a layer index, where l=1, ..., L, and where L is an integer.

A set (N, K, M) is a set of a number N of variable nodes 101, a number K of information bits, and a number M of check nodes, where N, K, and M are each an integer, and where M=N−K.

$H \in Z^{M \times N}$ is a parity check matrix, where $h_{ij}=1$ whenever a check node i 103 is connected to a variable node j 101 and zero otherwise, where i and j are each an integer.

$\Lambda = [\lambda_1, \lambda_2, \ldots, \lambda_N]^T \in R^N$ is an input LLR of the variable nodes 101, where T is an integer.

$\Gamma = [\gamma_1, \gamma_2, \ldots, \gamma_N]^T \in R^N$ is an output LLR of the variable nodes 101.

C(j) is a set of check node 103 indices connected to a variable node j 101, where j=1, ..., N.

V(i) is a set of variable node 101 indices connected to a check node i 103, where i=1, ..., M.

$w_i^{(l)}$ is an offset parameter on an i-th check node 103 of an l-th iteration.

$\alpha_{ij}^{(l)}$ is a check node 103 to variable node 101 (C2V) message from the i-th check node 103 to the j-th variable node 101.

$\beta_{ij}^{(l)}$ is a variable node 101 to check node 103 (V2C) message from the j-th variable node 101 to the i-th check node 103.

$f(\Gamma): R^N \to R$ is a cost function 105 such that $J=f(\Gamma)$.

An offset value may be different for each check node 103 at each iteration. However, if the offset value is fixed over all of the network, the gradient of the fixed offset value will be the sum of the individual offset values calculated from the previous network.

Figure 2:
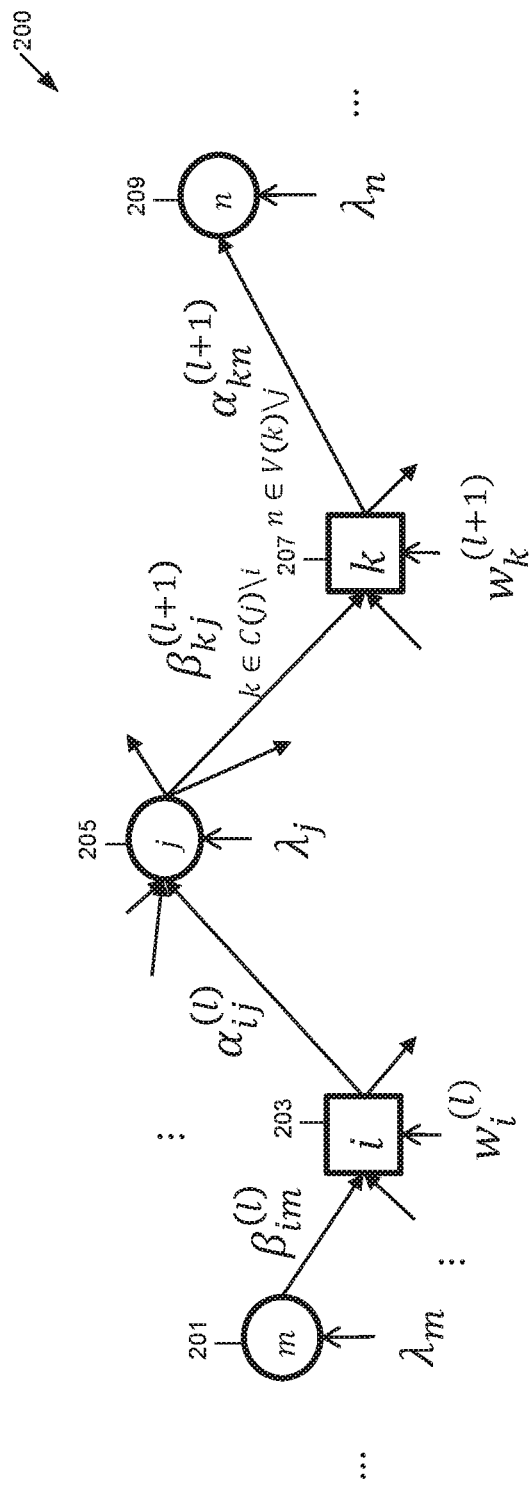
FIG. 2 is an illustration of min-sum calculations in layer 1 of parallel BP decoder, according to one embodiment.

FIG. 2 is an illustration of min-sum calculations in layer l of a parallel BP decoder, according to one embodiment.

Referring to FIG. 2, calculations of messages at layer l are shown, where m 201, j 205, and n 209 are variable nodes, and where i 203 and k 207 are check nodes.

In the present disclosure, $$\frac{dJ}{dw_i^{(l)}}$$

is found for all layers (l=1, ..., L). The chain rule is applied as in Equation (1) as follows:

$$\frac{dJ}{dw_i^{(l)}} = \sum_{j \in V(i)} \frac{\partial J}{\partial \alpha_{ij}^{(l)}} \frac{\partial \alpha_{ij}^{(l)}}{\partial w_i^{(l)}} = \sum_{j \in V(i)} \Delta_{\alpha,ij}^{(l)} A_{w,ij}^{(l)} \quad (1)$$

where $\Delta_{\alpha,ij}^{(l)} = \frac{\partial J}{\partial \alpha_{ij}^{(l)}}$ and $A_{w,ij}^{(l)} = \frac{\partial \alpha_{ij}^{(l)}}{\partial w_i^{(l)}}$ Since $$\alpha_{ij}^{(l)} = \left(\Pi_{j' \in V(i) \setminus j} \text{sign}(\beta_{ij'}^{(l)})\right) \max\left(\min_{j' \in V(i) \setminus j} |\beta_{ij'}^{(l)}| - w_i^{(l)}, 0\right),$$

the calculation of $A_{w,ij}^{(l)}$ is given by Equation (2) as follows:

$$A_{w,ij}^{(l)} = \frac{\partial \alpha_{ij}^{(l)}}{\partial w_i^{(l)}} = \begin{cases} -(\Pi_{j' \in V(i) \setminus j} \text{sign}(\beta_{ij'}^{(l)})), & \text{if } \min_{j' \in V(i) \setminus j} |\beta_{ij'}^{(l)}| > w_i^{(l)} = -\text{sign}(\alpha_{ij}^{(l)}) \\ 0, & \text{otherwise} \end{cases} \quad (2)$$

where sign(x)=0 for x=0.

In addition, $\Delta_{\alpha,ij}^{(l)}$ for all i 203, j 205 with $h_{ij}$=1, is given by Equation (3) as follows:

$$\Delta_{\alpha,ij}^{(l)} = \frac{\partial J}{\partial \alpha_{ij}^{(l)}} \sum_{k \in C(j) \setminus i} \frac{\partial J}{\partial \beta_{kj}^{(l+1)}} \frac{\partial \beta_{kj}^{(l+1)}}{\partial \alpha_{ij}^{(l)}} = \sum_{k \in C(j) \setminus i} \Delta_{\beta,kj}^{(l+1)} \quad (3)$$

where $\Delta_{\beta,kj}^{(l+1)} = \frac{\partial J}{\partial \beta_{kj}^{(l+1)}}$ and the last equality comes from the fact that $$\frac{\partial \beta_{kj}^{(l+1)}}{\partial \alpha_{ij}^{(l)}} = 1$$

because of the update rule of $\beta_{kj}^{(l+1)} = \lambda_j + \Sigma_{i' \in C(j) \setminus k} \alpha_{i'j}^{(l)}$ and $k \in C(j) \setminus i$ 207.

$\Delta_{\beta,kj}^{(l+1)}$ for $k \in C(j)$ 207, is calculated in Equation (4) as follows:

$$\Delta_{\beta,kj}^{(l+1)} = \frac{\partial J}{\partial \beta_{kj}^{(l+1)}} = \sum_{n \in V(k) \setminus j} \frac{\partial J}{\partial \alpha_{kn}^{(l+1)}} \frac{\partial \alpha_{kn}^{(l+1)}}{\partial \beta_{kj}^{(l+1)}} \sum_{n \in V(k) \setminus j} \Delta_{\alpha,kn}^{(l+1)} \delta_{\alpha kn \beta kj}^{(l+1)} \quad (4)$$

The computation of $\delta_{\alpha\beta}^{(l+1)}$ for $k \in C(j)$ 207 and $n \in V(k) \setminus j$ 209 is in Equation (5) as follows:

$$\delta_{\alpha kn \beta kj}^{(l+1)} = \frac{\partial \alpha_{kn}^{(l+1)}}{\partial \beta_{kj}^{(l+1)}} = \text{sign}'(\beta_{kj}^{(l+1)}) \text{sign}(\beta_{kj}^{(l+1)}) \alpha_{kn}^{(l+1)} + \quad (5)$$

$$\begin{cases} \text{sign}(\beta_{kj}^{(l+1)}) \text{sign}(\alpha_{kn}^{(l+1)})(1 - \text{sign}'(\beta_{kj}^{(l+1)}) w_k^{(l+1)}), \\ \quad \text{if } j = \underset{j' \in V(k) \setminus n}{\text{argmin}} |\beta_{kj'}^{(l+1)}| \text{ and } |\alpha_{kn}^{(l+1)}| > 0 \\ 0, \text{ otherwise} \end{cases}$$

where sign'(x) is the general derivative of sign(x).

A simplified computation with zero derivative for sign(x) is given in Equation (6) as follows:

$$\delta_{\alpha kn \beta kj}^{(l+1)} = \begin{cases} \text{sign}(\beta_{kj}^{(l+1)}) \text{sign}(\alpha_{kn}^{(l+1)}), & \text{if } j = \underset{j' \in V(k) \setminus n}{\text{argmin}} |\beta_{kj'}^{(l+1)}| \text{ and } \\ & |\alpha_{kn}^{(l+1)}| > 0 \\ 0, & \text{otherwise} \end{cases} \quad (6)$$

Therefore, the gradient of the offset value of the l-th layer (l<L) is given by Equation (7) as follows:

$$\Delta_{\beta,kj}^{(l+1)} = g(\Delta_{\alpha,kn}^{(l+1)}, \alpha_{kn}^{(l+1)}, \beta_{kn}^{(l+1)}|_{n \in V(k)}) = \quad (7)$$

$$\begin{cases} \text{sign}(\beta_{kj_1^*}^{(l+1)}) \sum_{n \in V(k) \setminus j_1^*} \Delta_{\alpha,kn}^{(l+1)} \text{sign}(\alpha_{kn}^{(l+1)}), & j = j_1^*(k) \\ \text{sign}(\beta_{kj_2^*}^{(l+1)}) \Delta_{\alpha,kj_1^*}^{(l+1)} \text{sign}(\alpha_{kj_1^*}^{(l+1)}), & j = j_2^*(k) \\ 0, & \text{otherwise} \end{cases}$$

where sign(x)=0 for x=0, and $j_1^*(k)$ and $j_2^*(k)$ are variable node indexes 205 such that $|\beta_{kj_1^*}^{(l+1)}|$ and $|\beta_{kj_2^*}^{(l+1)}|$ are the first and the second minimum of $$\min_{j \in V(k)} |\beta_{kj}^{(l+1)}|.$$

For the initial condition of l=L, Equation (8) is as follows:

$$\alpha_{ij}^{(L)} = \left( \prod_{j' \in V(i) \setminus j} \text{sign}(\beta_{ij'}^{(L)}) \right) \max\left( \prod_{j' \in V(i) \setminus j} |\beta_{ij'}^{(L)}| - w_i^{(L)}, 0 \right) \text{ and } \gamma_j = \quad (8)$$

$$\lambda_j + \sum_{i' \in C(j)} \alpha_{i'j}^{(l)}$$

Therefore, the update rule for $$\frac{\partial j}{\partial \alpha_{ij}^{(l)}}$$

does not follow directly as for the case of l<L but instead, $$\frac{\partial j}{\partial \alpha_{ij}^{(l)}}$$

may be computed from the previous relationship for i 203, j 205 with $h_{ij}$=1 as in Equation (9) as follows:

$$\frac{\partial J}{\partial \alpha_{ij}^{(L)}} = \frac{\partial J}{\partial \gamma_j} \frac{\partial \gamma_j}{\partial \alpha_{ij}^{(L)}} = \frac{\partial J}{\partial \gamma_j} = [\nabla_\Gamma J]_j \quad (9)$$

Figure 3:
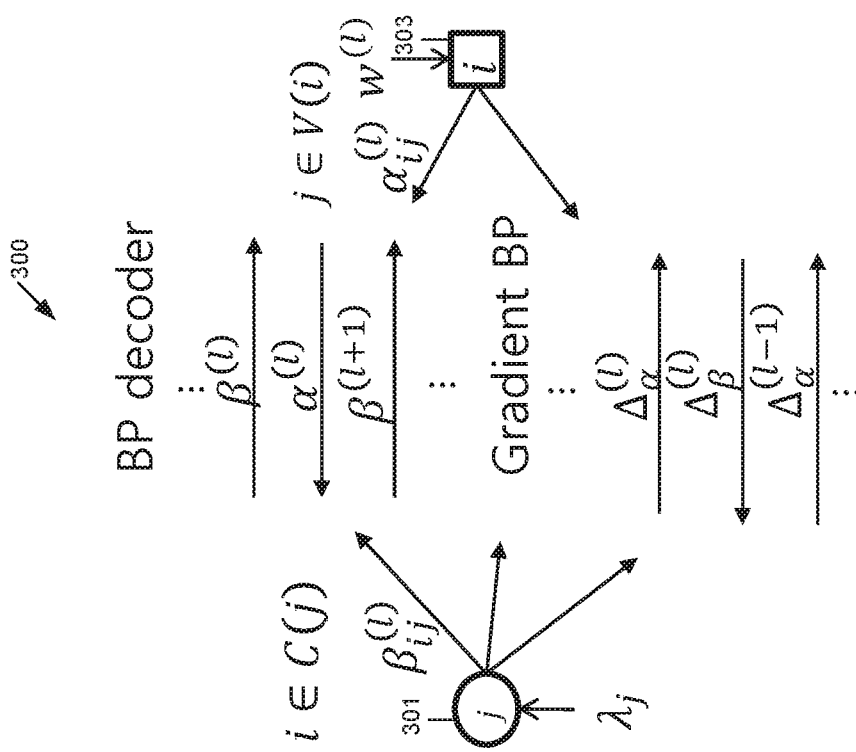
FIG. 3 is an illustration of parallel BP decoder and gradient calculations with update rules, according to one embodiment.

FIG. 3 is an illustration of parallel BP decoder 300 and gradient calculations with update rules, according to one embodiment.

Referring to FIG. 3, the BP and backpropagation processes are summarized, where j 301 is a variable node, and where i 303 is a check node.

Figure 4:
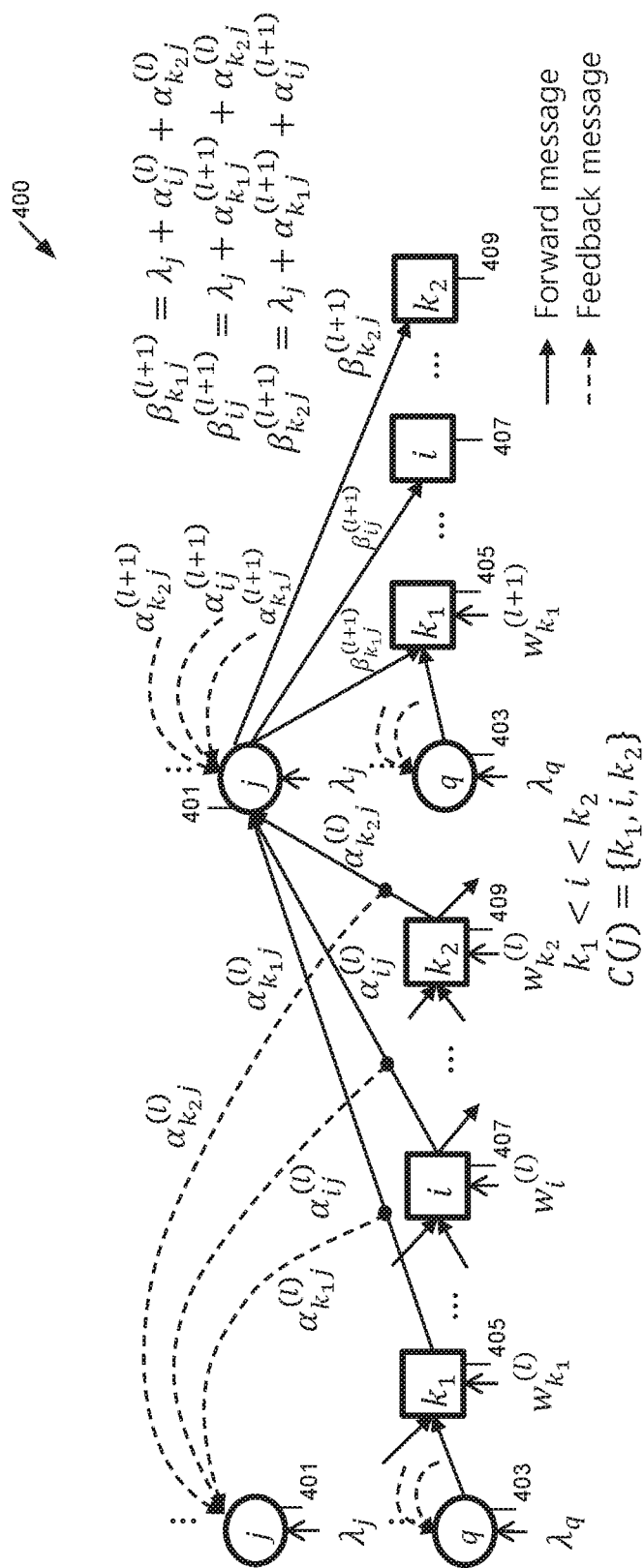
FIG. 4 is an illustration of sequential BP message flow, according to one embodiment.

FIG. 4 is an illustration of a sequential BP message flow, according to one embodiment.

Referring to FIG. 4, gradient calculations are extended to any scheduling method, where j 401 and q 403 are variable nodes, and where $k_1$ 405, i 407, and $k_2$ 409 are check nodes. A scheduling method is mainly defined by an order of processing check nodes. Sequential scheduling is used as an example. However, the present disclosure may use any scheduling method. In a similar manner to a parallel BP schedule, a sequential BP method is illustrated in FIG. 4.

Sequential scheduling processes check-node by check-node. Therefore, after the processing of each check node, the processed messages are fed back to all connected variable nodes before processing the following check nodes which is illustrated by the dashed lines with arrows. A graphical interpretation of sequential BP decoding in described below in greater detail.

Each sequential C2V update may be a sublayer within each of L layers of a network, where each of the L layers have M sublayers representing L-iterations of M sequential C2V updates.

Additionally, each C2V message $\alpha_{ij}^{(l)\ in\ the}$ l-th layer has a virtual feedback to an associated incoming variable node (indicated by the dotted lines with arrows).

The feedback C2Vs are used in V2C updates within the sublayers so long as the feedback C2Vs meet a causality constraint. That is, $\alpha_{k_1 j}^{(l+1)}$ instead of $\alpha_{k_1 j}^{(l)}$ is used in $\beta_{ij}^{(l+1)}$ update if $k_1 < i$.

A general update rule at iteration l is shown in Equations (10) and (11) as follows:

$$\alpha_{ij}^{(l)} = \left( \prod_{j' \in V(i) \setminus j} \text{sign}(\beta_{ij'}^{(l)}) \right) \max \left( \min_{j' \in V(i) \setminus j} |\beta_{ij'}^{(l)}| - w_i^{(l)}, 0 \right) \quad (10)$$

$$\beta_{kj}^{(l+1)} = \lambda_j + \sum_{\substack{i_1 \in C(j) \\ i_1 > k}} \alpha_{i_1 j}^{(l)} + \sum_{\substack{i_2 \in C(j) \\ i_2 < k}} \alpha_{i_2 j}^{(l+1)} \quad (11)$$

Compared to the parallel BP decoding case, $\Delta_{\alpha,ij}^{(l)}$ may be modified in Equation (12) as follows:

$$\Delta_{\alpha,ij}^{(l)} = \frac{\partial J}{\partial \alpha_{ij}^{(l)}} = \sum_{\substack{k_1 \in C(j) \\ k_1 < i}} \frac{\partial J}{\partial \beta_{k_1 j}^{(l+1)}} \frac{\partial \beta_{k_1 j}^{(l+1)}}{\partial \alpha_{ij}^{(l)}} + \sum_{\substack{k_2 \in C(j) \\ k_2 > i}} \frac{\partial J}{\partial \beta_{k_2 j}^{(l)}} \frac{\partial \beta_{k_2 j}^{(l)}}{\partial \alpha_{ij}^{(l)}} = \quad (12)$$

$$\sum_{\substack{k_1 \in C(j) \\ k_1 < i}} \Delta_{\beta, k_1 j}^{(l+1)} + \sum_{\substack{k_2 \in C(j) \\ k_2 > i}} \Delta_{\beta, k_1 j}^{(l)}$$

The initial condition of the backpropagation process may be the only initial condition that must be dealt with carefully, where Equations (13) and (14) as follows:

$$\beta_{kj}^{(L)} = \lambda_j + \sum_{\substack{i_1 \in C(j) \\ i_1 > k}} \alpha_{i_1 j}^{(L-1)} + \sum_{\substack{i_2 \in C(j) \\ i_2 < k}} \alpha_{i_2 j}^{(L)} \quad (13)$$

$$\gamma_j = \lambda_j + \sum_{i' \in C(j)} \alpha_{i' j}^{(L)} \quad (14)$$

Equations (15) and (16) are as follows:

$$\Delta_{\alpha,ij}^{(L)} = \frac{\partial J}{\partial \gamma_j} \frac{\partial \gamma_j}{\partial \alpha_{ij}^{(L)}} + \sum_{\substack{k \in C(j) \\ k > i}} \frac{\partial J}{\partial \beta_{kj}^{(L)}} \frac{\partial \beta_{kj}^{(L)}}{\partial \alpha_{ij}^{(L)}} = [\nabla_\Gamma J]_j + \sum_{\substack{k \in C(j) \\ k > i}} \Delta_{\beta,kj}^{(L)} \quad (15)$$

$$\Delta_{\beta,ij}^{(L)} = g\left( \beta_{ij_1^*}^{(L)}, \beta_{ij_2^*}^{(L)}, \Delta_{\alpha,in}^{(L)}, \alpha_{in}^{(L)} |_{n \in V(i)} \right) \quad (16)$$

Error functions that match BER and BLER are described below.

Equation (17) is a cross entropy error function as follows:

$$H(t, \gamma) = -\Sigma_{i=1}^n t_i \log \sigma(\gamma_i) + (1 - t_i) \log(1 - \sigma(\gamma_i)), \quad (17)$$

where $t_i$ is a true bit at location i which may be regarded as a genie transmitted bit, and $$\sigma(\gamma_i) = \frac{1}{1 + e^{-\gamma_i}},$$

and n is a codeword length, where n is an integer.

Equation (18) is a mean square error (MSE) error function as follows:

$$MSE = \frac{1}{2n} \sum_{i=1}^n (t_i - \sigma(\gamma_i))^2 \quad (18)$$

Equation (19) is a p-norm error function as follows:

$$pnorm = \frac{1}{pn} \sqrt[p]{\sum_{i=1}^n (t_i - \sigma(\gamma_i))^p} \quad (19)$$

In order to identify a reasonable cost function for a given purpose, bit error rate (BER) performance and block error rate (BLER) performance with an offset value may be considered. The BLER and the BER versus the offset value for a new radio LDPC (NR-LDPC) code with base-graph-1, may have a code rate of 0.9176 and a lifting factor of 16. In this case, $$\arg \min_{\text{offset}} BER \neq \arg \min_{\text{offset}} BLER.$$

To minimize a BER, the cross-entropy function and the MSE function are good candidates for a cost function, while the large norm cost function such as a 10-norm cost function is a good candidate for minimizing a BLER.

An offset value exhibits convergence behavior under parallel and sequential BP with different initial offset values.

Since possible code parameters such as code rate may take many possibilities, determining an optimal offset value for each code parameter and channel condition might become a computational burden which requires a large lookup table to store the optimal offset value for each transmission environment.

According to one embodiment, the present system and method provides online learning where an offset value may be learned during the actual transmission depending on the environment setup at the time of learning. The present disclosure may provide a larger search space where the offset value may be different at each iteration and at each check node and train the offset values with a different environment setup to find offset values that are good for all cases.

Online learning as described below with reference to FIG. 5 may be used to determine an optimal offset value during a transmission. In one embodiment, a transmission environment such as code parameters and channel conditions may be fixed for a sufficient time to enable learning in a certain case (e.g., an NR LDPC standard). For example, during one transport block transmission in NR which may contain up to 400 code blocks, code parameters and channel conditions may be fixed over all the code blocks. However, learning requires knowledge of a correct codeword as well. Therefore, a receiver requires a correct codeword to perform gradient calculations. A cyclic-redundancy-check (CRC) may be used to determine a correct codeword. The correctness of decoding a codeword is checked via a CRC. With very high probability, a codeword that passes a CRC is a correct codeword and may be used in gradient calculations. Two approaches for online learning including progressive learning and feedback learning are described below in greater detail with reference to FIGS. 6 and 7.

Figure 5:
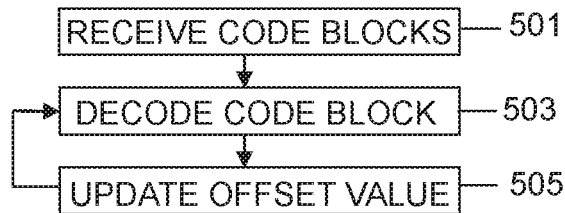
FIG. 5 is a flowchart of an online learning method, according to one embodiment.

FIG. 5 is a flowchart of an online learning method, according to one embodiment.

Referring to FIG. 5, at 501, a decoder receives code blocks (e.g., code blocks or codewords) of a transport block, an initial value of an offset value is set (e.g., 0.5), and the online learning method proceeds to 503.

At 503, the decoder decodes a code block and the online learning method proceeds to 605.

At 505, an offset value updater updates the offset value and the online learning method either proceeds to 503 for additional processing of received code blocks or terminates.

Figure 6:
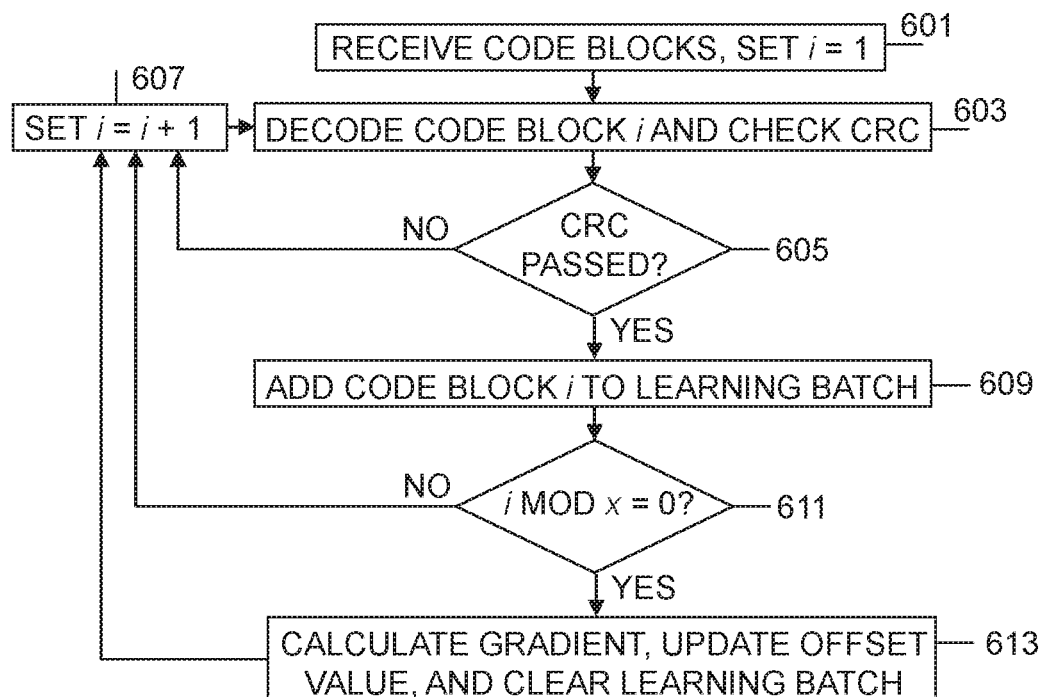
FIG. 6 is a flowchart of a progressive learning method, according to one embodiment.

FIG. 6 is a flowchart of a progressive learning method, according to one embodiment.

Referring to FIG. 6, at 601, a decoder receives code blocks (e.g., code blocks or codewords) of a transport block, an index i is set to 1 in a counter, an initial value of an offset value is set (e.g., 0.5), and the progressive learning method proceeds to 603.

At 603, the decoder decodes a code block with index i, a cyclic redundancy checker performs a CRC on code block i, and the progressive learning method proceeds to 605.

At 605, the method determines whether code block i passes the CRC in the cyclic redundancy checker or not. If code block i does not pass the CRC in the cyclic redundancy checker, the progressive learning method proceeds to 607. Otherwise, the progressive learning method proceeds to 609.

At 607, a counter increments index i (e.g., i is set to i+1) and the progressive learning method returns to 603.

At 609, the method adds code block i to a learning batch (e.g., code block i is stored in a memory) and the progressive learning method proceeds to 611.

At 611, a modulo function block performs i modulo x, and a comparator determines whether i modulo x is equal to 0, where x is a predetermined integer, and where the modulo function may be referred to as "MOD" or by a percentage symbol "%." If i modulo x is not equal to 0, which indicates that x code blocks have not passed the CRC, the progressive learning method proceeds to 607. Otherwise, the progressive learning method proceeds to 613, which indicates that x code blocks have passed the CRC. The decoder starts with the initial offset value (e.g., 0.5) then during the progressive learning method, the offset value is updated after every x code blocks are correctly decoded, where the updated offset value may be updated after the next x code blocks are correctly decoded. Based on the results, an optimal value for x may be determined.

At 613, a gradient calculator calculates a gradient of a pre-determined error function, updates an offset value based on the calculated gradient, clears the learning batch (e.g., the code blocks stored in the learning batch are erased), and the progressive learning method either proceeds to 607 for additional processing of received code blocks or terminates.

Figure 7:
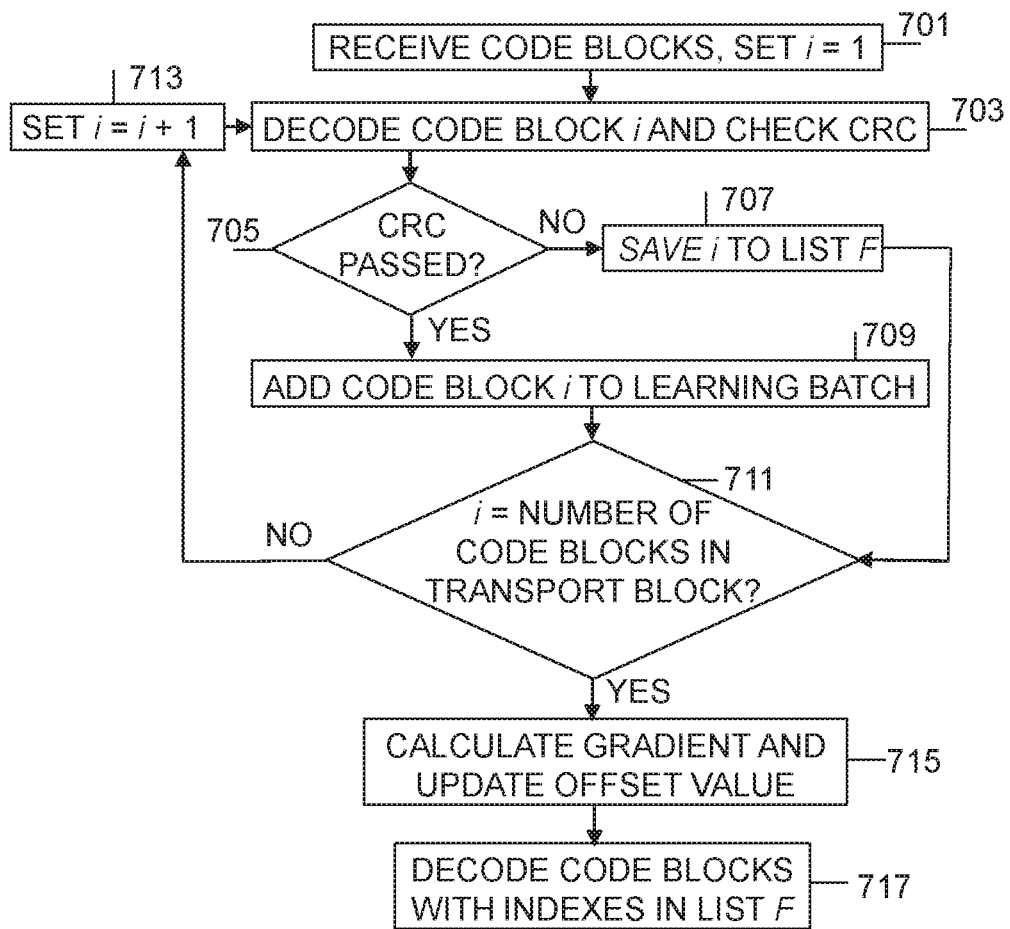
FIG. 7 is a flowchart of a feedback learning method, according to one embodiment.

FIG. 7 is a flowchart of a feedback learning method, according to one embodiment.

Referring to FIG. 7, at 701, a decoder receives code blocks (e.g., code blocks or codewords) of a transport block, an index i is set to 1 in a counter, an initial value of an offset value is set (e.g., 0.5), and the feedback learning method proceeds to 703.

At 703, the decoder decodes a code block with index i, a cyclic redundancy checker performs a CRC on code block i, and the feedback learning method proceeds to 705.

At 705, the cyclic redundancy checker determines whether code block i passes the CRC or not. If code block i does not pass the CRC in the cyclic redundancy checker, the feedback learning method proceeds to 707. Otherwise, the feedback learning method proceeds to 709.

At 707, the method saves index i to a list F (e.g., index i is stored in a memory) and the feedback learning method proceeds to 711.

At 709, the method adds code block i to a learning batch (e.g., code block i is stored in the memory) and the feedback learning method proceeds to 711.

At 711, a comparator determines whether i is equal to a number of code blocks in the transport block. If i is not equal to the number of code blocks in the transport block, the feedback learning method proceeds to 713. Otherwise, the feedback learning method proceeds to 715.

At 713, a counter increments index i (e.g., i is set to i+1) and the feedback learning method returns to 703.

At 715, a gradient calculator calculates a gradient on a pre-determined error function, updates the offset value based on the calculated gradient, and the feedback learning method proceeds to 717.

At 717, the decoder decodes each code block with an index i in the list F and the feedback learning method terminates.

In the feedback learning method, the decoder decodes all of the code blocks in the transport block using an initial offset value (e.g., 0.5). Then, an updated offset value is learned from all of the correctly decoded code blocks. Then, the decoder re-attempts to decode the code blocks that previously failed to be decoded (i.e., the code blocks for which the CRC did not pass) using the newly learned offset value.

Figure 8:
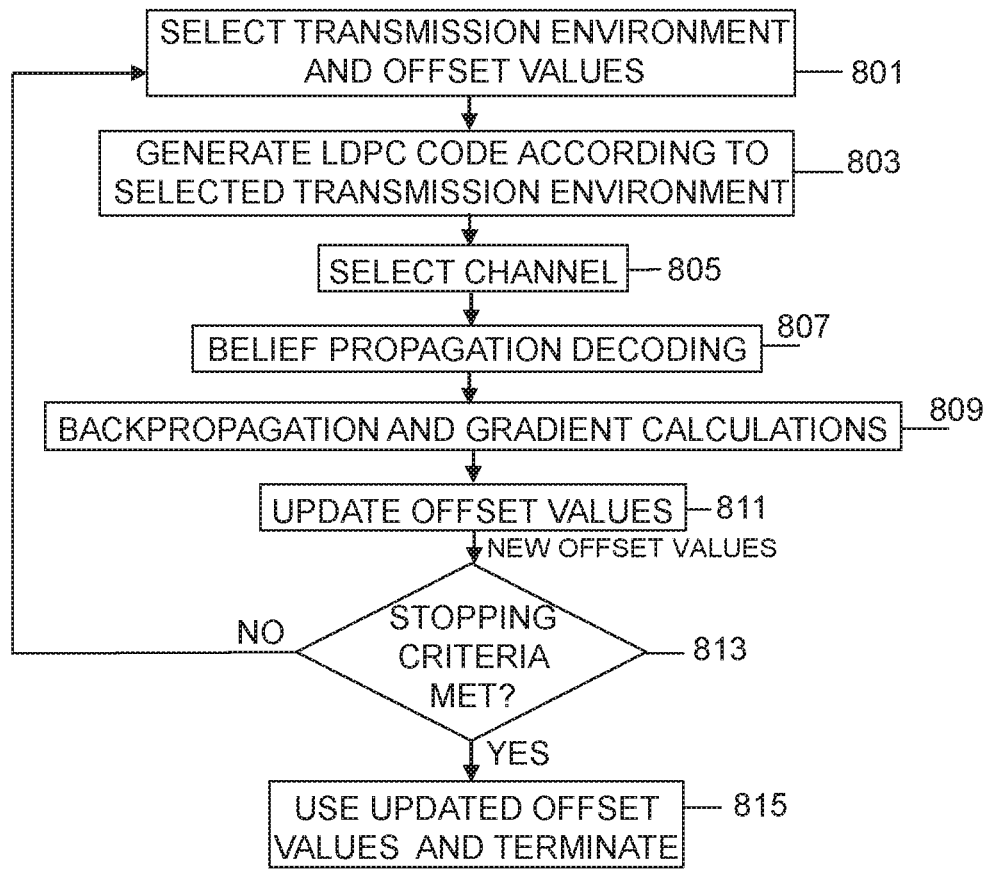
FIG. 8 is a flowchart of a method of updating an offset value with a large search space under different transmission environments, according to one embodiment.

FIG. 8 is a flowchart of a method of updating an offset value in a large search space under different transmission environments, according to one embodiment.

Referring to FIG. 8, a method of updating an offset value that may be used in all scenarios is illustrated. In the method, the offset search space is increased by allowing a different offset value at each check node in each iteration. That is, the offset value is updated using a large space of offset values and a mix of transmission environments (e.g., different code rates).

At 801, the method selects a transmission environment (e.g., a code rate) and an initial offset value (e.g., 0.5) and the method proceeds to 803.

At 803, a code generator generates an LDPC code according the selected transmission environment and the method proceeds to 805.

At 805, the method selects a channel (e.g., an additive white Gaussian noise (AWGN) channel) and the method proceeds to 807.

At 807, a decoder decodes the LDPC code using BP decoding and the method proceeds to 809.

At 809, the method applies backpropagation to the LDPC code, a gradient calculator calculates gradients of a predetermined error function, and the method proceeds to 811.

At 811, the method updates the offset values based on the gradients calculated by the gradient calculator and the method proceeds to 813.

At 813, the method determines if a stop criteria is met. If a stop criteria is not met, the method returns to 801. Otherwise, the method proceeds to 815.

At 815, the updated offset values are used and the method is terminated.

Figure 9:
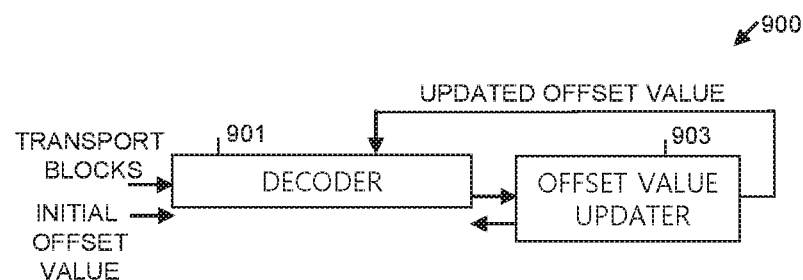
FIG. 9 is an apparatus for online learning, according to an embodiment.

FIG. 9 is an apparatus 900 for online learning, according to an embodiment.

Referring to FIG. 9, the apparatus 900 includes a decoder 901 and an offset value updater 903.

The decoder 901 includes a first input for receiving transport blocks (e.g., code blocks or codewords), a second input for receiving an initial offset value (e.g., 0.5), a third input for receiving an updated offset value, a fourth input for receiving an index for a next code block of the received transport blocks to be decoded by the decoder 901, and an output.

The offset value updater 903 includes an input connected to the output of the decoder 901, a first output connected to the fourth input of the decoder 901 for providing an index for a next code block of the received transport blocks to be decoded by the decoder 901, and a second output connected to the third input of the decoder 901 for providing an updated offset value to be used by the decoder 901 to decode the next code block of the received transport blocks.

Figure 10:
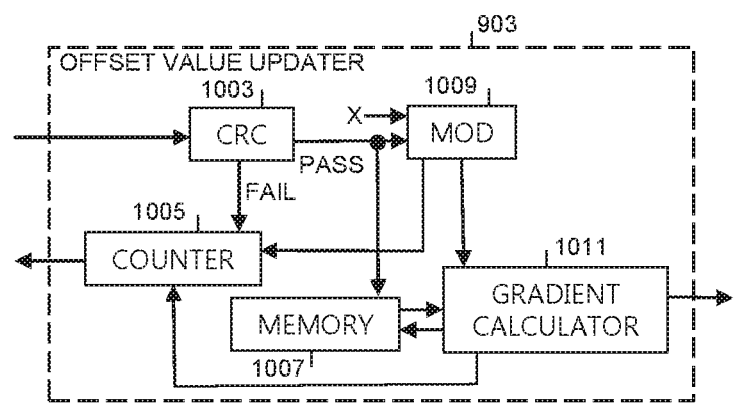
FIG. 10 is an apparatus for an offset value updater, according to an embodiment.

FIG. 10 is an apparatus for the offset value updater 903 of FIG. 9 for progressive learning, according to an embodiment.

Referring to FIG. 10, the offset value updater 903 includes a CRC device 1003, a counter 1005, a memory 1007, a modulus device 1009, and gradient calculator 1011.

The CRC device 1003 includes an input for receiving a decoded code word and determining whether the decoded codeword passes or fails a cyclic-redundancy-check, a first output for indicating that a decoded codeword fails a cyclic-redundancy-check, and a second output for indicating that a decoded codeword passes a cyclic-redundancy-check.

The counter 1005 includes a first input connected to the first output of the CRC device 1003 to indicate that a decoded codeword has not passed a cyclic-redundancy-check and an index should be incremented to indicate a next codeword to be decoded, a second input for receiving an indication that a certain number x of decoded codewords has passed a cyclic-redundancy-check and an index should be incremented to indicate a next codeword to be decoded, a third input for receiving an indication that an offset value is updated and an index should be incremented to indicate a next codeword to be decoded, and an output for outputting an incremented index that indicates a next codeword to be decoded.

The memory 1007 includes a first input connected to the second output of the CRC device 1003 for storing each decoded codeword that passes a cyclic-redundancy-check (e.g., adding each decoded codeword that passes a cyclic-redundancy-check to a learning batch), a second input for receiving an indication to erase the memory after an offset value is updated (e.g., clear the learning batch), and an output to provide the stored decoded codewords that passed a cyclic-redundancy-check (e.g., provide the learning batch).

The modulus device 1009 includes a first input for receiving x, where x is an integer that indicates how many decoded codewords must pass a cyclic-redundancy-check before an offset value is updated, a second input connected to the second output of the CRC device 1003, a first output connected to the second input of the counter 1005 for indicating that x decoded codewords have not passed a cyclic-redundancy-check, and a second output for indicating that x decoded codewords have passed a cyclic-redundancy-check.

The gradient calculator 1011 includes a first input connected to the second output of the modulus device 1009 for receiving an indication that x decoded codewords have passed a cyclic-redundancy-check and that the gradient calculator 1011 is to calculate a gradient of an error function of a decoder and update an offset value based on the calculated gradient, a second input connected to the output of the memory 1007 to receive the decoded codewords that passed a cyclic-redundancy-check (e.g., receive the learning batch), a first output connected to the second input of the memory 1007 for erasing the memory 1007 (e.g., clearing the learning batch), a second output connected to the third input of the counter 1005 for incrementing the index that indicates a next codeword to be decoded, and a third output for outputting an updated offset value.

Figure 11:
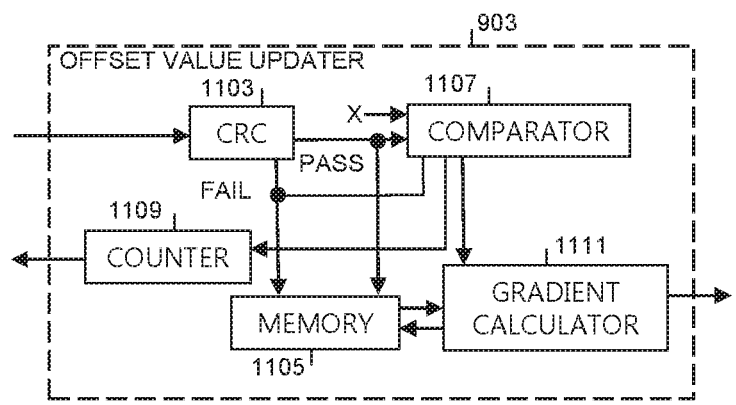
FIG. 11 is an apparatus for an offset value updater, according to an embodiment.

FIG. 11 is an apparatus for the offset value updater 903 of FIG. 9 for feedback learning, according to an embodiment.

Referring to FIG. 11, the offset value updater 903 includes a CRC device 1103, a memory 1105, a comparator 1107, a counter 1109, and gradient calculator 1111.

The CRC device 1103 includes an input for receiving a decoded code word and determining whether the decoded codeword passes or fails a cyclic-redundancy-check, a first output for indicating that a decoded codeword fails a cyclic-redundancy-check, and a second output for indicating that a decoded codeword passes a cyclic-redundancy-check.

The memory 1105 includes a first input connected to the first output of the CRC device 1103 for storing each decoded codeword that fails a cyclic-redundancy-check (e.g., adding each decoded codeword that fails a cyclic-redundancy-check to a failed list or F list), a second input connected to the second output of the CRC device 1103 for storing each decoded codeword that passes a cyclic-redundancy-check (e.g., adding each decoded codeword that passes a cyclic-redundancy-check to a learning batch), a third input for receiving an indication to erase the memory after an offset value is updated (e.g., clear the F list and the learning batch), and an output to provide the stored decoded codewords that failed a cyclic-redundancy-check (e.g., provide the F list) and the stored decoded codewords that passed a cyclic-redundancy-check (e.g., provide the learning batch).

The comparator 1107 includes a first input for receiving x, where x is an integer that indicates a number of codewords in a transport block, a second input connected to the first output of the CRC device 1103 to indicate that a decoded codeword has failed a cyclic-redundancy-check, a third input connected to the second output of the CRC device 1103 to indicate that a decoded codeword has passed a cyclic-redundancy-check, a first output for indicating that all of the codewords in a transport have not been decoded, and a second output for indicating that all of the codewords in a transport have been decoded. The comparator 1107 adds a number of decoded codewords that failed the cyclic-redundancy-check to a number of decoded codewords that passed the cyclic-redundancy-check and compares the sum to x to determine if all of the codewords in a transport block have been decoded or not.

The counter 1109 includes an input connected to the first output of the comparator 1107 for receiving an indication that not all of the codewords in a transport block have been decoded, and an output for outputting an incremented index to indicate a next codeword to be decoded. The counter 1109 increments an index to indicate a next codeword to be decoded.

The gradient calculator 1111 includes a first input connected to the second output of the comparator 1107 for receiving an indication that all of the codewords in a transport block have been decoded, a second input connected to the output of the memory 1105 to receive the decoded codewords that failed a cyclic-redundancy-check (e.g., receive the F list) and the decoded codewords that passed a cyclic-redundancy-check (e.g., receive the learning batch), a first output connected to the third input of the memory 1105 for erasing the memory 1105 (e.g., clearing the F list and the learning batch), and a second output for outputting an updated offset value to be used for a next transport block and the decoded codewords that failed a cyclic-redundancy-check (e.g., the F list) to be decoded using the updated offset value.

Figure 12:
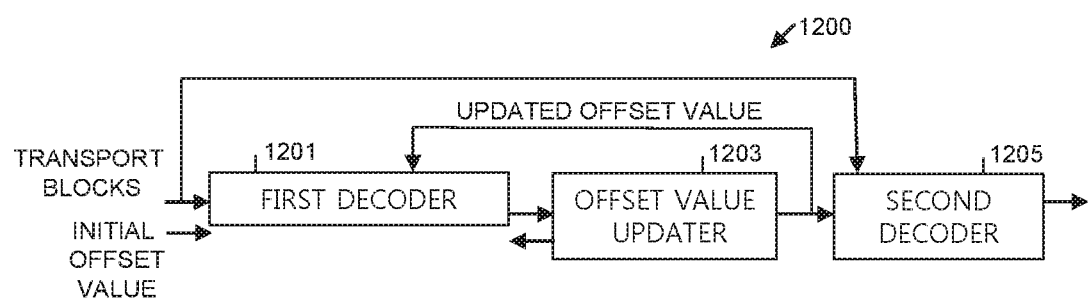
FIG. 12 is an apparatus for feedback learning, according to an embodiment.

FIG. 12 is an apparatus 1200 for feedback learning, according to an embodiment.

Referring to FIG. 12, the apparatus 1200 includes a first decoder 1201, an offset value updater 1203, and a second decoder 1205.

first decoder 1201 includes a first input for receiving transport blocks (e.g., code blocks or codewords), a second input for receiving an initial offset value (e.g., 0.5), a third input for receiving an updated offset value, a fourth input for receiving an index for a next code block of the received transport blocks to be decoded by the first decoder 1201, and an output.

The offset value updater 1203 includes an input connected to the output of the first decoder 1201, a first output connected to the fourth input of the first decoder 1201 for providing an index for a next code block of the received transport blocks to be decoded by the first decoder 1201, and a second output connected to the third input of the first decoder 1201 for providing an updated offset value to be used by the first decoder 1201 to decode the next code block of the received transport blocks. The offset value updater 1203 may be the offset value updater 903 of FIG. 11.

The second decoder 1205 includes a first input connected to the first input of the first decoder 1201 for receiving the received transport blocks (e.g., code blocks or codewords), a second input connected to the output of the offset value updater 1203, and an output.

In order to find offset values that are good for two different code rates, during the training phase, the offset value is trained under two different cases, a high code rate and a low code rate.

For example, a case may be where an LDPC code is constructed from 24 check nodes at a signal to noise ratio (SNR) of 2.5 dB.

For example, a case may be where an LDPC code is constructed from 46 check nodes at an SNR of 0.5 dB.

Table 1 below is a summary of BLER results at the specified SNR when the offset is trained specifically for the case and when the offset is trained via a mix of two rates.

TABLE 1

|  | Fixed offset of 0.5 | Each case individually trained | Training is performed via a mix of the two cases |
|---|---|---|---|
| Case 1 (24 check nodes, SNR = 2.5 dB) | 6.66e−2 | 4.8e−2 | 5.6e−2 |
| Case 2 (46 check nodes, SNR = 0.5 dB) | 2.49e−2 | 1.94e−2 | 1.9769e−2 |

Table 1 above shows that if the offset is trained for a mix of the inputs, the result is almost invariant for Case 2 while some loss in performance is expected for Case 1 but is still better than a fixed offset value of 0.5. Thus, the offset value can be updated with mixed inputs to be used in different scenarios.

In order to update an offset value over different iterations, a large number of iterations may be used (e.g., 5 or 6 iterations).

According to one embodiment, the present system and method for decoding LDPC codes, via online learning during transmission of LDPC codes, by a BP decoder and a corresponding backpropagation network includes receiving a code block including LPDC codes; performing BP decoding of the code block using OMS decoding and an initial offset value; performing a CRC on the decoded code block; in response to the decoded code block passing CRC, adding the code block to a set of learning blocks; and applying belief backpropagation to the set of learning blocks to update the offset value by at least calculating a gradient of an error function of the decoder with respect to the offset value, updating the offset value in a direction that reduces an error output of the error function, and clearing the set of learning blocks.

According to another embodiment, the present system and method of finding optimal offset values for decoding LDPC codes by a BP decoder and a corresponding backpropagation network includes receiving LPDC codes, generated according to a transmission environment, transmitted over a channel; performing BP decoding of the code block using OMS decoding and an initial offset value; and applying backpropagation to the code block to update the offset value by at least calculating a gradient of an error function of the decoder with respect to the offset value, updating the offset value in a direction that reduces an error output of the error function, evaluating the updated offset value against a criterion to determine whether the updated offset value is sufficiently optimized, and in response to determining that the updated offset value is sufficiently optimized, using the updated offset value to decode subsequent LPDC codes.

Figure 13:
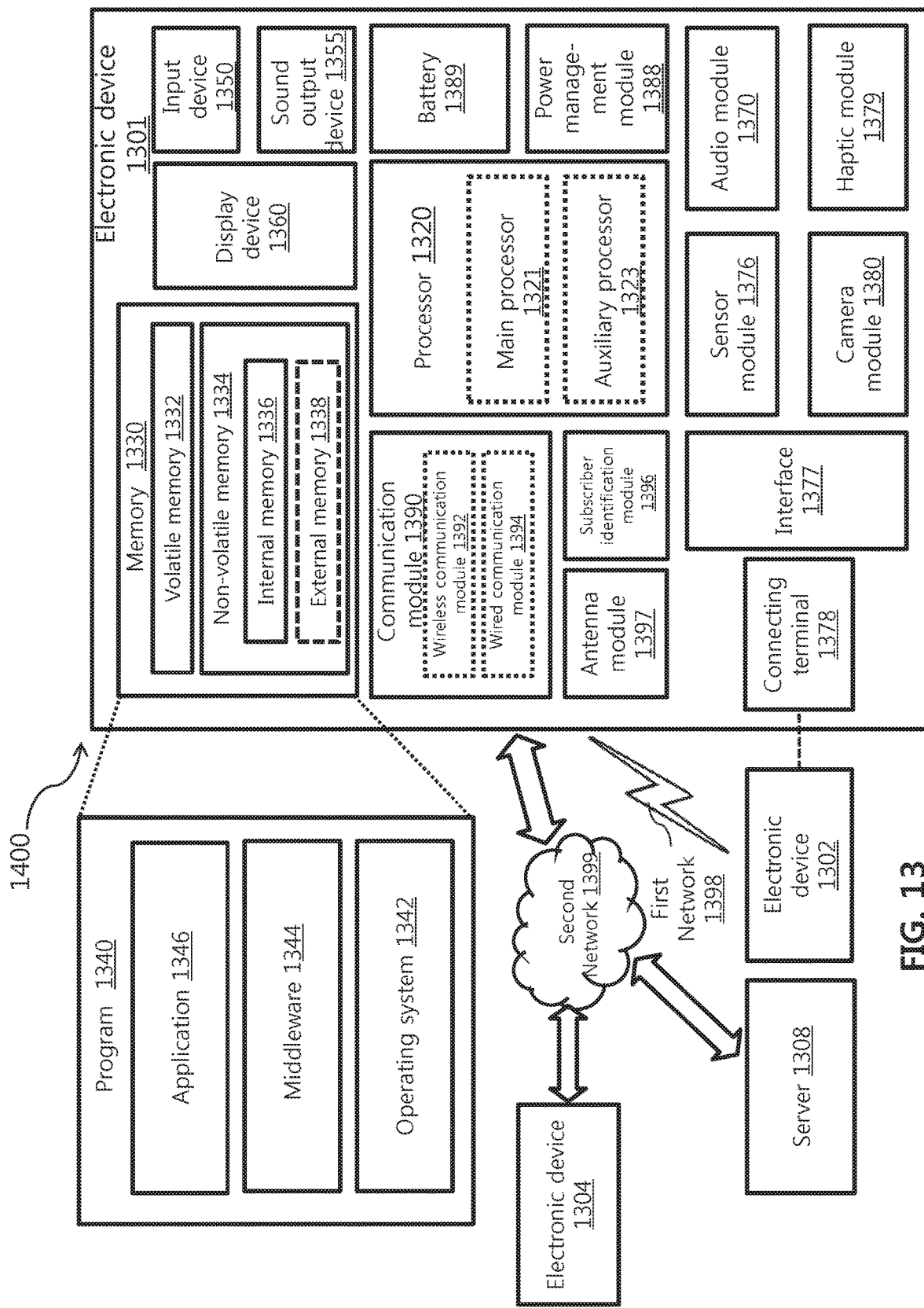
FIG. 13 is a block diagram of an electronic device in a network environment to which an apparatus and a method of the present disclosure is applied, according to one embodiment.

FIG. 13 is a block diagram illustrating an electronic device 1301 in a network environment 1300 according to various embodiments.

Referring to FIG. 13, the electronic device 1301 in the network environment 1300 may communicate with an electronic device 1302 via a first network 1398 (e.g., a short-range wireless communication network), or an electronic device 1304 or a server 1308 via a second network 1399 (e.g., a long-range wireless communication network). According to an embodiment, the electronic device 1301 may communicate with the electronic device 1304 via the server 1308. According to an embodiment, the electronic device 1301 may include a processor 1320, memory 1330, an input device 1350, a sound output device 1355, a display device 1360, an audio module 1370, a sensor module 1376, an interface 1377, a haptic module 1379, a camera module 1380, a power management module 1388, a battery 1389, a communication module 1390, a subscriber identification module (SIM) 1396, or an antenna module 1397. In some embodiments, at least one (e.g., the display device 1360 or the camera module 1380) of the components may be omitted from the electronic device 1301, or one or more other components may be added in the electronic device 1301. In some embodiments, some of the components may be implemented as single integrated circuitry. For example, the sensor module 1376 (e.g., a fingerprint sensor, an iris sensor, or an illuminance sensor) may be implemented as embedded in the display device 1360 (e.g., a display).

The processor 1320 may execute, for example, software (e.g., a program 1340) to control at least one other component (e.g., a hardware or software component) of the electronic device 1301 coupled with the processor 1320, and may perform various data processing or computation. According to one embodiment, as at least part of the data processing or computation, the processor 1320 may load a command or data received from another component (e.g., the sensor module 1376 or the communication module 1390) in volatile memory 1332, process the command or the data stored in the volatile memory 1332, and store resulting data in non-volatile memory 1334. According to an embodiment, the processor 1320 may include a main processor 1321 (e.g., a central processing unit (CPU) or an application processor (AP)), and an auxiliary processor 1323 (e.g., a graphics processing unit (GPU), an image signal processor (ISP), a sensor hub processor, or a communication processor) that is operable independently from, or in conjunction with, the main processor 1321. Additionally or alternatively, the auxiliary processor 1323 may be adapted to consume less power than the main processor 1321, or to be specific to a specified function. The auxiliary processor 1323 may be implemented as separate from, or as part of the main processor 1321.

The auxiliary processor 1323 may control at least some of functions or states related to at least one component (e.g., the display device 1360, the sensor module 1376, or the communication module 1390) among the components of the electronic device 1301, instead of the main processor 1321 while the main processor 1321 is in an inactive (e.g., sleep) state, or together with the main processor 1321 while the main processor 1321 is in an active state (e.g., executing an application). According to an embodiment, the auxiliary processor 1323 (e.g., an image signal processor or a communication processor) may be implemented as part of another component (e.g., the camera module 1380 or the communication module 1390) functionally related to the auxiliary processor 1323.

The memory 1330 may store various data used by at least one component (e.g., the processor 1320 or the sensor module 1376) of the electronic device 1301. The various data may include, for example, software (e.g., the program 1340) and input data or output data for a command related thereto. The memory 1330 may include the volatile memory 1332 or the non-volatile memory 1334.

The program 1340 may be stored in the memory 1330 as software, and may include, for example, an operating system (OS) 1342, middleware 1344, or an application 1346.

The input device 1350 may receive a command or data to be used by another component (e.g., the processor 1320) of the electronic device 1301, from the outside (e.g., a user) of the electronic device 1301. The input device 1350 may include, for example, a microphone, a mouse, a keyboard, or a digital pen (e.g., a stylus pen).

The sound output device 1355 may output sound signals to the outside of the electronic device 1301. The sound output device 1355 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1360 may visually provide information to the outside (e.g., a user) of the electronic device 1301. The display device 1360 may include, for example, a display, a hologram device, or a projector and control circuitry to control a corresponding one of the display, hologram device, and projector. According to an embodiment, the display device 1360 may include touch circuitry adapted to detect a touch, or sensor circuitry (e.g., a pressure sensor) adapted to measure the intensity of force incurred by the touch.

The audio module 1370 may convert a sound into an electrical signal and vice versa. According to an embodiment, the audio module 1370 may obtain the sound via the input device 1350, or output the sound via the sound output device 1355 or a headphone of an external electronic device (e.g., an electronic device 1302) directly (e.g., wired) or wirelessly coupled with the electronic device 1301.

The sensor module 1376 may detect an operational state (e.g., power or temperature) of the electronic device 1301 or an environmental state (e.g., a state of a user) external to the electronic device 1301, and then generate an electrical signal or data value corresponding to the detected state. According to an embodiment, the sensor module 1376 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1377 may support one or more specified protocols to be used for the electronic device 1301 to be coupled with the external electronic device (e.g., the electronic device 1302) directly (e.g., wired) or wirelessly. According to an embodiment, the interface 1377 may include, for example, a high definition multimedia interface (HDMI), a universal serial bus (USB) interface, a secure digital (SD) card interface, or an audio interface.

A connecting terminal 1378 may include a connector via which the electronic device 1301 may be physically connected with the external electronic device (e.g., the electronic device 1302). According to an embodiment, the connecting terminal 1378 may include, for example, a HDMI connector, a USB connector, a SD card connector, or an audio connector (e.g., a headphone connector).

The haptic module 1379 may convert an electrical signal into a mechanical stimulus (e.g., a vibration or a movement) or electrical stimulus which may be recognized by a user via his tactile sensation or kinesthetic sensation. According to an embodiment, the haptic module 1379 may include, for example, a motor, a piezoelectric element, or an electric stimulator.

The camera module 1380 may capture a still image or moving images. According to an embodiment, the camera module 1380 may include one or more lenses, image sensors, image signal processors, or flashes.

The power management module 1388 may manage power supplied to the electronic device 1301. According to one embodiment, the power management module 1388 may be implemented as at least part of, for example, a power management integrated circuit (PMIC).

The battery 1389 may supply power to at least one component of the electronic device 1301. According to an embodiment, the battery 1389 may include, for example, a primary cell which is not rechargeable, a secondary cell which is rechargeable, or a fuel cell.

The communication module 1390 may support establishing a direct (e.g., wired) communication channel or a wireless communication channel between the electronic device 1301 and the external electronic device (e.g., the electronic device 1302, the electronic device 1304, or the server 1308) and performing communication via the established communication channel. The communication module 1390 may include one or more communication processors that are operable independently from the processor 1320 (e.g., the AP) and supports a direct (e.g., wired) communication or a wireless communication. According to an embodiment, the communication module 1390 may include a wireless communication module 1392 (e.g., a cellular communication module, a short-range wireless communication module, or a global navigation satellite system (GNSS) communication module) or a wired communication module 1394 (e.g., a local area network (LAN) communication module or a power line communication (PLC) module). A corresponding one of these communication modules may communicate with the external electronic device via the first network 1398 (e.g., a short-range communication network, such as Bluetooth™, wireless-fidelity (Wi-Fi) direct, or Infrared Data Association (IrDA)) or the second network 1399 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1392 may identify and authenticate the electronic device 1301 in a communication network, such as the first network 1398 or the second network 1399, using subscriber information (e.g., international mobile subscriber identity (IMSI)) stored in the subscriber identification module 1396.

The antenna module 1397 may transmit or receive a signal or power to or from the outside (e.g., the external electronic device) of the electronic device 1301. According to an embodiment, the antenna module 1397 may include an antenna including a radiating element composed of a conductive material or a conductive pattern formed in or on a substrate (e.g., PCB). According to an embodiment, the antenna module 1397 may include a plurality of antennas. In such a case, at least one antenna appropriate for a communication scheme used in the communication network, such as the first network 1398 or the second network 1399, may be selected, for example, by the communication module 1390 (e.g., the wireless communication module 1392) from the plurality of antennas. The signal or the power may then be transmitted or received between the communication module 1390 and the external electronic device via the selected at least one antenna. According to an embodiment, another component (e.g., a radio frequency integrated circuit (RFIC)) other than the radiating element may be additionally formed as part of the antenna module 1397.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1301 and the external electronic device 1304 via the server 1308 coupled with the second network 1399. Each of the electronic devices 1302 and 1304 may be a device of a same type as, or a different type, from the electronic device 1301. According to an embodiment, all or some of operations to be executed at the electronic device 1301 may be executed at one or more of the external electronic devices 1302, 1304, or 1308. For example, if the electronic device 1301 should perform a function or a service automatically, or in response to a request from a user or another device, the electronic device 1301, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1401. The electronic device 1301 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1340) including one or more instructions that are stored in a storage medium (e.g., internal memory 1336 or external memory 1338) that is readable by a machine (e.g., the electronic device 1301). For example, a processor 1320 of the machine (e.g., the electronic device 1301) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus, comprising:
   a decoder including a first input configured to receive transport blocks, a second input, and an output configured to provide a decoded codeword, and
   an offset value updater including an input connected to the output of the decoder, and an output, connected to the second input of the decoder, configured to provide an updated offset value.

2. The apparatus of claim 1, wherein the offset value updater comprises a cyclic-redundancy-checker (CRC) including an input connected to the output of the decoder, a first output configured to indicate when a decoded codeword does not pass a cyclic-redundancy-check, and a second output configured to indicate when the decoded codeword passes the cyclic-redundancy-check.

3. The apparatus of claim 2, wherein the offset value updater further comprises a counter including a first input connected to the first output of the CRC and an output configured to provide an index for a next codeword to be decoded.

4. The apparatus of claim 2, wherein the offset value updater further comprises a modulus device including a first input for receiving an integer x, a second input connected to the second output of the CRC, a first output configured to indicate that less than x decoded codewords have passed the cyclic-redundancy-check, and a second output configured to indicate when x decoded codewords have passed the cyclic-redundancy-check.

5. The apparatus of claim 4, wherein the offset value updater further comprises:
   a memory including a first input connected to the second output of the CRC, a second input, and an output configured to provide decoded codewords that pass the cyclic-redundancy-check; and
   a gradient calculator including a first input connected to the second output of the modulus device, a second input connected to the output of the memory, a first output connected to the second input of the memory and configured to erase the memory, and an output connected to the second input of the decoder and configured to provide the updated offset value based on an error function of the decoder.

6. The apparatus of claim 5, wherein the error function comprises one of a cross entropy error function, a mean square error function, and a p-norm error function.

7. The apparatus of claim 2, wherein the offset value updater further comprises a comparator including a first input for receiving an integer x, a second input connected to the first output of the CRC, a third input connected to the second output of the CRC, a first output configured to indicate that less than x codewords are decoded, and a second output configured to indicate when x decoded codewords are decoded.

8. The apparatus of claim 7, wherein the offset value updater further comprises:
   a memory including a first input connected to the first output of the CRC, a second input connected to the second output of the CRC, a third input, and an output configured to provide decoded codewords that fail and pass the cyclic-redundancy-check; and
   a gradient calculator including a first input connected to the second output of the comparator, a second input connected to the output of the memory, a first output connected to the third input of the memory and configured to erase the memory, and an output connected to the second input of the decoder and configured to provide the updated offset value based on an error function of the decoder and the decoded codewords that failed the cyclic-redundancy-check.

9. The apparatus of claim 8, further comprising a second decoder including a first input connected to the first input of the decoder, a second input connected to the output of the gradient calculator and configured to receive the updated offset value and the decoded codewords that failed the cyclic-redundancy-check, and an output configured to re-decode the codewords that failed the cyclic-redundancy-check using the updated offset value.

10. The apparatus of claim 7, wherein the offset value updater further comprises a counter including an input connected to the first output of the comparator, and an output configured to provide an index for a next codeword to be decoded.

11. The apparatus of claim 8, wherein the error function comprises one of a cross entropy error function, a mean square error function, and a p-norm error function.

12. The apparatus of claim 10, wherein an initial offset value is 0.5 and the index of the next codeword to be decoded is initially set to 1.

13. A method, comprising:
receiving, through a first input of a first decoder, a plurality of codewords and an index that indicates which of the plurality of codewords is to be decoded;
decoding, by the first decoder, one of the plurality of codewords indicated by the index; and
updating, by an offset value updater including an output connected to a second input of the first decoder, an offset value.

14. The method of claim 13, wherein updating the offset value comprises indicating, by a cyclic-redundancy-checker (CRC), when a decoded one of the plurality of codeword does not pass and passes a cyclic-redundancy-check.

15. The method of claim 14, wherein updating the offset value further comprises incrementing the index, by a counter, when the decoded one of the plurality of codeword fails the cyclic-redundancy-check or when a number of decoded codewords that passes the cyclic-redundancy-check is less than x, where x is an integer.

16. The method of claim 14, wherein updating the offset value further comprises:
storing, by a memory, decoded codewords that pass the cyclic-redundancy-check; and
providing, by a gradient calculator, an updated offset value based on an error function of a second decoder and erasing the memory.

17. The method of claim 16, wherein the error function includes one of a cross entropy error function, a mean square error function, and a p-norm error function.

18. The method of claim 14, wherein updating the offset value further comprises indicating, by a modulus device, when x decoded codewords pass the cyclic-redundancy-check.

19. The method of claim 14, wherein updating the offset value further comprises:
storing, by a memory, decoded codewords that failed and passed the cyclic-redundancy-check;
indicating, by a comparator, when less than x codewords are decoded and when x decoded codewords are decoded;
incrementing, by a counter, the index to the next one of the plurality of codewords to be decoded; and
providing, by a gradient calculator, an updated offset value based on an error function of a second decoder and the decoded codewords that failed the cyclic-redundancy-check configured and erasing the memory.

20. The method of claim 19, further comprising:
receiving, by the second decoder, the updated offset value and the decoded codewords that failed the cyclic-redundancy-check; and
re-decoding, by a third decoder, the codewords that failed the cyclic-redundancy-check using the updated offset value.

* * * * *